US010690699B2

United States Patent
Rodriguez, Jr. et al.

(10) Patent No.: US 10,690,699 B2
(45) Date of Patent: Jun. 23, 2020

(54) HOLDER WITH SELF-ALIGNING FEATURE FOR HOLDING CURRENT SENSOR AROUND LINE CONDUCTOR

(71) Applicant: 3M INNOVATIVE PROPERTIES COMPANY, St. Paul, MN (US)

(72) Inventors: Ernesto M. Rodriguez, Jr., Irondale, AZ (US); William E. Haushalter, Spicewood, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 281 days.

(21) Appl. No.: 15/188,290

(22) Filed: Jun. 21, 2016

(65) Prior Publication Data
US 2017/0363661 A1 Dec. 21, 2017

(51) Int. Cl.
*G01R 15/18* (2006.01)
*G01R 19/00* (2006.01)

(52) U.S. Cl.
CPC ....... *G01R 15/181* (2013.01); *G01R 19/0092* (2013.01)

(58) Field of Classification Search
CPC .......................... G01R 15/181; G01R 19/0092
See application file for complete search history.

(56) References Cited

U.S. PATENT DOCUMENTS

| 4,777,381 A | 10/1988 | Fernandes |
| 7,312,686 B2 | 12/2007 | Bruno |
| 8,342,494 B2 * | 1/2013 | Ricci .................... G01R 15/186 269/86 |
| 9,267,970 B2 | 2/2016 | Moreux et al. |
| 2008/0284410 A1 * | 11/2008 | Perez .................... G01R 15/142 324/120 |
| 2012/0306487 A1 | 12/2012 | Yao et al. |

(Continued)

FOREIGN PATENT DOCUMENTS

| CN | 203216974 | 9/2013 |
| CN | 204269714 | 4/2015 |

(Continued)

OTHER PUBLICATIONS

Manuale D'Uso E Di Installazione Dispositivo RGDAT, Rilevatore Di Guasto Direzionale E Di Assenza Tensione (RGDAT) A Specifica, Descrizione Tecnica SD 7865, Enel DY 1059 Ed. Feb 2004, 32 pages.

(Continued)

*Primary Examiner* — Tung X Nguyen
*Assistant Examiner* — Feba Pothen
(74) *Attorney, Agent, or Firm* — Gregg H. Rosenblatt

(57) ABSTRACT

A holder for a current sensor having separable portions with inner surfaces forming an opening and opposing outer surfaces having a groove to accommodate a current sensing coil. The holder includes flexible members on the portions and extending toward the opening such that the flexible members can hold a power cable substantially centered within the opening and concentric with the current sensing coil. The portions are joined together with a hinge pivotally mounted between them at one end and a releasable clasp joining them together at another end, providing for ease of installation around the power cable by hand and without requiring tools or additional fasteners.

20 Claims, 3 Drawing Sheets

(56) References Cited

U.S. PATENT DOCUMENTS

| | | |
|---|---|---|
| 2014/0159744 A1 | 6/2014 | Hozoi et al. |
| 2015/0219691 A1 | 8/2015 | Cook et al. |
| 2016/0223592 A1 | 8/2016 | Vos |

FOREIGN PATENT DOCUMENTS

| | | |
|---|---|---|
| DE | 1099635 | 2/1961 |
| EP | 2592426 | 5/2013 |
| FR | 2896592 | 7/2007 |
| WO | WO 2009/139521 | 11/2009 |

OTHER PUBLICATIONS

International Search Report for Application No. PCT/IB2017/053434, dated Nov. 30, 2017, 3pgs.

\* cited by examiner

HOLDER WITH SELF-ALIGNING FEATURE FOR HOLDING CURRENT SENSOR AROUND LINE CONDUCTOR

BACKGROUND

Rogowski type current sensors are used to measure current on power cables for underground applications. Managing a way to attach these sensors in the field and keeping the cable highly concentric in the holder can be challenging. The existing designs are burdensome for attachment by field personnel and usually require other components, such as tie wraps, for mechanical attachment and which makes it difficult to hold in a correct orientation on the power cable.

SUMMARY

A holder for a current sensor, consistent with the present invention, includes first and second portions at least partially separable from one another and each having an inner surface, an opposing outer surface, and a groove on the outer surface. The inner surfaces form an opening through the first and second portions, and the grooves in the outer surfaces join one another. The holder also includes a plurality of flexible members on the first and second portions and extending toward the opening such that the flexible members can hold a line conductor substantially centered within the opening.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of this invention cover a holder design for Rogowski type current sensors or other sensors. The holder allows for self-alignment and concentric positioning for various size low and medium voltage cables within grade level and underground utility applications. The holder is hinged on one end and provides a snap feature clasp on the other, which enables easy hands-on attachment with bare hands, or utility personnel with gloves, and without tools or additional aligning pieces. The holder has flexible features which allow for tension and the ability to self-align to a variety of different power cable diameters, while keeping its concentricity to within a tight tolerance, which is an important factor in calibration and thus accuracy of the measurement from the sensor. The holder can self-align to the power cables without requiring any other type of alignment parts such as tie-wraps or springs. The holder also has an integral feature for removing and attaching the current sensor with minimal intrusion or damage to the sensor coil.

Figure 1:
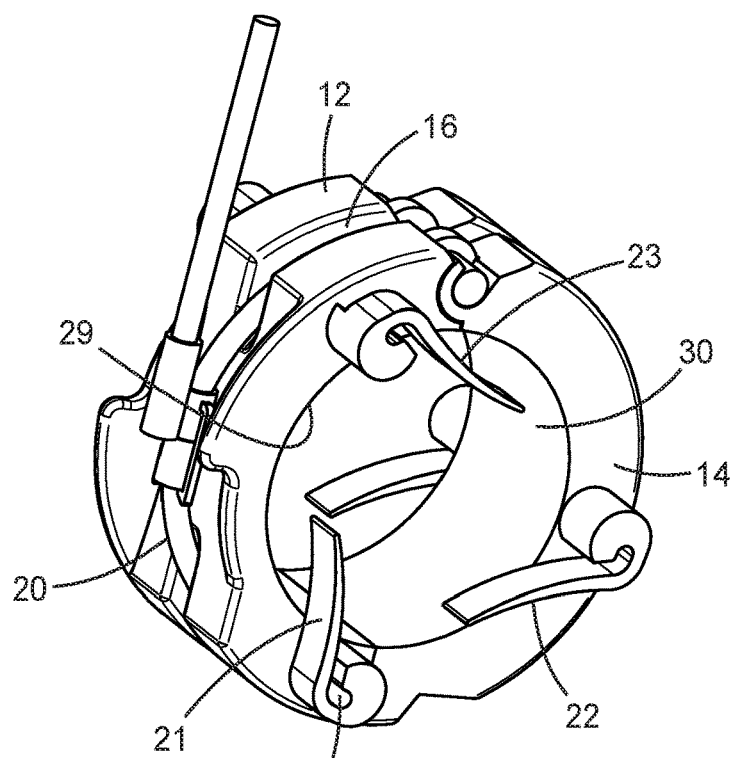
FIG. 1 is a perspective view of the holder.
Figure 2:
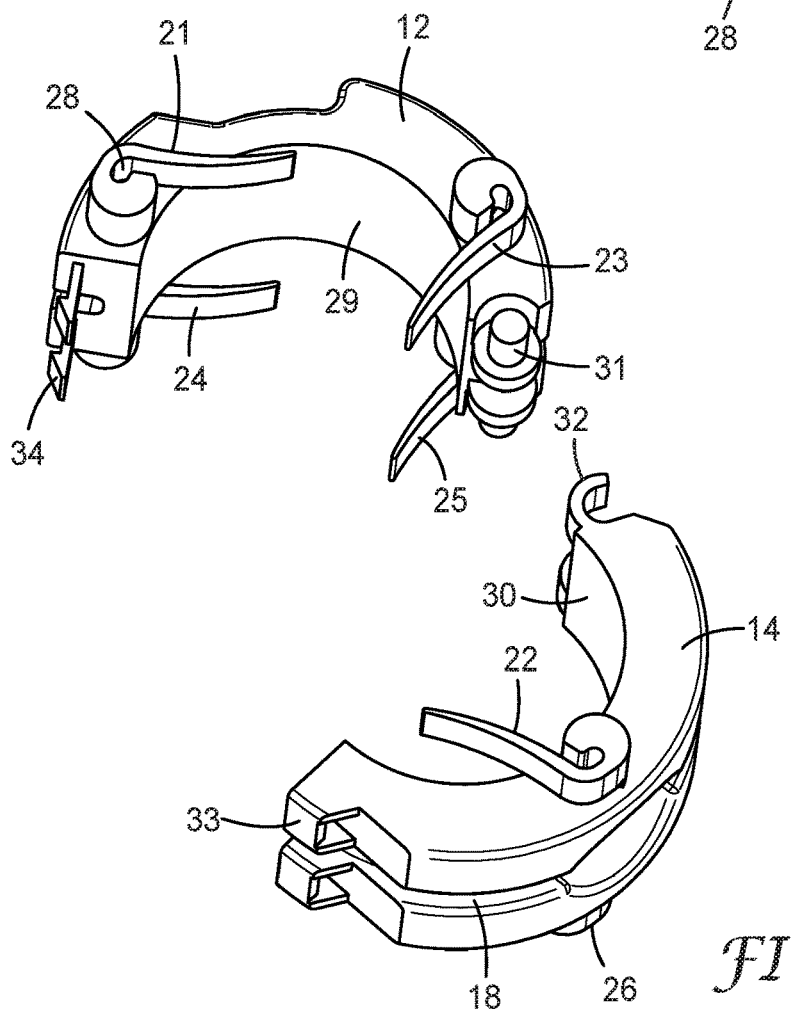
FIG. 2 is a perspective view of the holder as disassembled.
Figure 3:
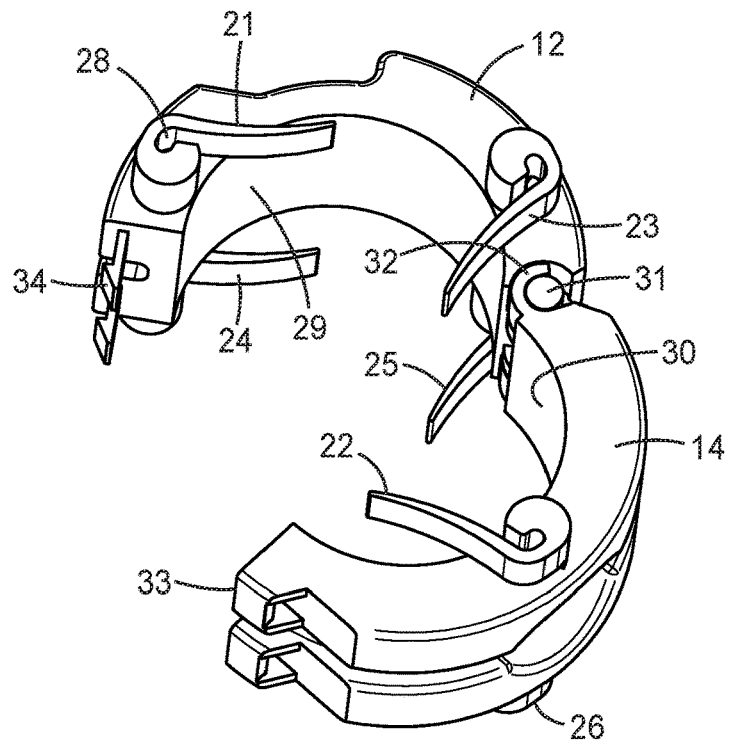
FIG. 3 is a perspective view of the holder partially assembled for installation around a line conductor.

FIG. 1 is a perspective view of the holder with a current sensing coil. FIGS. 2 and 3 are, respectively, perspective views of the holder as disassembled and as partially assembled for installation around a line conductor. As shown in FIGS. 1-3, the holder includes a portion 12 and a portion 14 that fit together. Portion 12 includes an inner surface 29, an opposing outer surface, and flexible members 21, 23, 24, and 25 on an edge of portion 12 adjacent inner surface 29. Portion 14 includes an inner surface 30, an opposing outer surface, and flexible members 22 and 26 on an edge of portion 14 adjacent inner surface 30. The flexible members can include a void, for example void 28 in flexible member 21, to obtain a longer flexure length of the flexible members. Portion 12 includes a groove 16, and portion 14 includes a groove 18 that joins with groove 16. Grooves 16 and 18 together form a continuous groove within or on the outer surfaces of portions 12 and 14 to accommodate a current sensing coil 20. Portions 12 and 14 include a hinge formed by curved fingers 32 on an end of portion 14 that mate with posts 31 on and end of portion 12. Portions 12 and 14 also includes a releasable clasp formed by latching fingers 34 on an end of portion 12 that releasably interlock with extended portions 33 forming apertures on an end of portion 14. Portions 12 and 14 can be completely separable at the hinge and clasp, as shown, or alternatively portions 12 and 14 can be partially separable by having a fixed hinge and a clasp that releasably interlocks.

Figure 4:
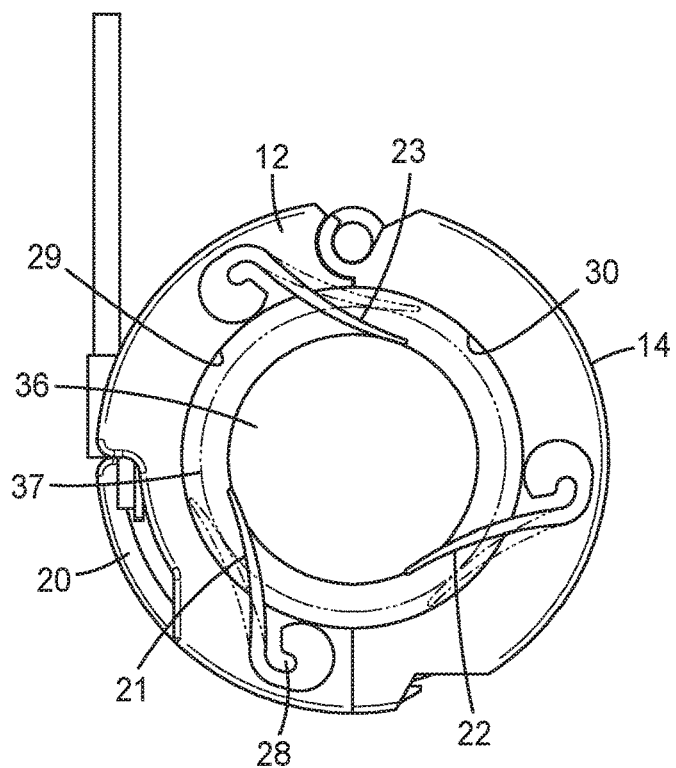
FIG. 4 is a side view of the holder in use positioned around a line conductor.

FIG. 4 is a side view of the holder in use positioned around a line conductor. In particular, inner surfaces 29 and 30 of portions 12 and 14, respectively, form an opening, and the flexible members hold a line conductor 36 substantially centered in the opening. As shown, flexible members 21, 22, and 23 hold line conductor 36 on one side of portions 12 and 14, and flexible members 24, 25, and 26 hold line conductor 36 on the other (opposing) side of portions 12 and 14 in a similar manner. The flexible members can hold line conductors of varying sizes in the opening, as illustrated by dashed line 37 representing a line conductor with a larger diameter than line conductor 36. By holding line conductor 36 substantially centered within the opening, line conductor 36 is also held substantially concentric with current sensing coil 20.

Figure 5:
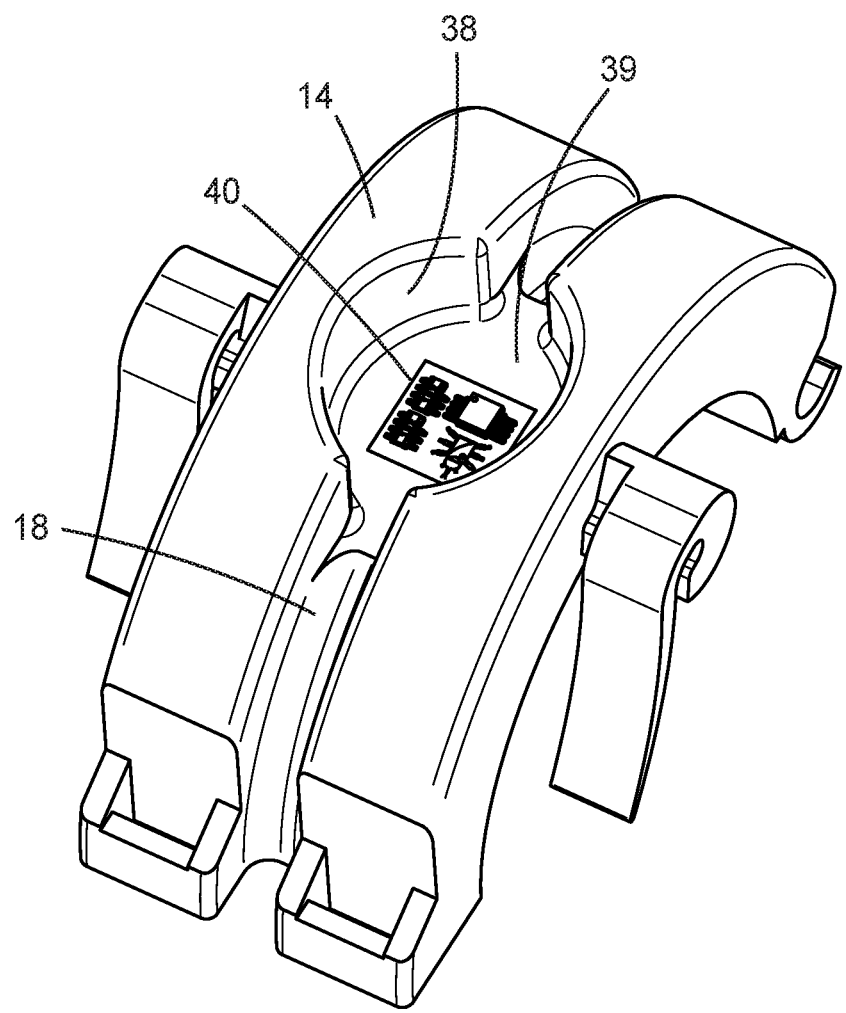
FIG. 5 is a perspective view of an alternate embodiment of a portion of the holder with recess for accommodating a circuit board.

FIG. 5 is a perspective view of an alternate embodiment of a portion of the holder with a recess for accommodating a circuit board. In particular, portion 14 can have a recess 38 with a planar bottom surface 39 for accommodating a circuit board 40. Current sensing coil 20 in groove 18 would be positioned over circuit board 40 through recess 38. Portion 12 can in addition, or alternatively, include a recess for accommodating a circuit board.

The following are exemplary materials and configurations for the holder described herein.

The two portions (12, 14) that fit together and the flexible members (21-26) can be molded with a thermoplastic type of material. The flexible members can be molded together with the two portions, for example using the same mold. Alternatively, the flexible members can be secured to the two portions after formation, such as molding, of the two portions; for example, the flexible members can be pressed on or bonded to the two portions.

A conductive wire or thin cable can be used for the current sensing coil in the groove around the outer surfaces of the two portions. The line conductor is typically a power cable.

The holder preferably has at least three flexible members on each side with the flexible members preferably evenly spaced apart to make the holder self-aligning with respect to various size line conductors. The holder can have more than three flexible members on each opposing side. Having the line conductor centered or held in a concentric manner within the opening of the holder and close to the current sensing coil is important for accurate readings from a current sensor coupled to the coil. The flexible members can have sufficient flexibility and tension to hold the line conductor substantially centered in the opening formed by the two portions and preferably have enough flexibility and tension to hold line conductors of different diameters substantially centered.

Holding the line conductor substantially centered involves two critical positioning variables, an angle and a position of the holder (and hence the current sensing coil) with respect to the line conductor. The phrase "substantially centered" means the line conductor is sufficiently centered within the holder to for provide an accurate reading from the current sensing coil in the holder. As one example and to provide for highly accurate current sensor readings, the phrase "substantially centered" can mean that the line conductor is held with an angle tolerance of less than two degrees with respect to the holder and is concentric in the holder within five millimeters of the line conductor diameter.

The opening formed by the inner surfaces of the two portions is preferably circular as shown. Alternatively, the opening can have other shapes, and the inner surfaces can have a series of planar surfaces rather that curved surfaces as shown. The outer surfaces of the two portions preferably form a curved surface concentric with circular opening formed by the inner surfaces in order to hold the current sensing coil substantially concentric with the line conductor held in the opening.

The circuit board can be a rigid or flexible circuit with a sensor and possibly a short range wireless transmitter. The sensor can monitor an environmental condition, for example, and generate sensor data providing an indication of the monitored condition. The short range wireless transmitter can send the sensor data periodically to a local receiver that can have a network connection for further transmitting the sensor data to a utility company or other entity. The sensor can be implemented with sensors to monitor one or more of the following conditions: humidity; temperature; sound; smoke; and gas. The temperature on the line conductor is important to sense and monitor for possible thermal break down and degradation of components. The circuit board can have a power harvesting circuit to self-power the sensor by power harvested from the line conductor. The circuit board can also be used for asset tagging or asset management, which is a way to identify the properties and active status of the line conductor or cable. In particular, the circuit board can have a memory for storing one or more of the following for the cable: an identifier or name; a type of the cable; a position of the cable; destinations the cable connects to; maintenance history; and whether the cable is live or not. This asset management information can be read, or transmitted, from the circuit board in the same manner as transmission of the sensor data, for example using the wireless short range transmitter.

An example of a current sensor is disclosed in U.S. patent application Ser. No. 14/613,589, entitled "Electronic Integrator for Rogowski Coil Sensors," and filed Feb. 4, 2015, which is incorporated herein by reference as if fully set forth.

An example of a power harvesting circuit is disclosed in U.S. patent application Ser. No. 14/661,468, entitled "Inductive Power Harvester with Power Limiting Capability," and filed Mar. 18, 2015, which is incorporated herein by reference as if fully set forth.

The invention claimed is:

1. A holder for a current sensor, comprising:
    a first portion having a first inner surface, a first opposing outermost radial surface, a first opposing side surface and a second opposing side surface, wherein each side surface extends radially outward from the first inner surface to the first outermost radial surface, and a first groove formed in and extending along a circumferential length of the first outermost radial surface;
    a second portion having a second inner surface, a second opposing outermost radial surface, a first opposing side surface and a second opposing side surface, wherein each side surface extends radially outward from the second inner surface to the second outermost radial surface, and a second groove formed in and extending along a length of the second outermost radial surface, wherein the first portion is at least partially separable from the second portion, the first and second inner surfaces defining an opening through the first and second portions, and the first groove joins the second groove; and
    a plurality of flexible members on the first and second portions and extending toward the opening;
    wherein the flexible members are configured to hold a line conductor substantially centered within the opening, wherein the first and second inner surfaces are disposed proximate to the line conductor when the line conductor is disposed within the opening,
    and wherein the first groove and the second groove are each configured to join one another and receive a current sensing coil.

2. The holder of claim 1, wherein at least a first flexible member is disposed on the first opposing side surface between the first inner surface and the first opposing outermost radial surface of the first portion and a second flexible member is disposed on the opposing second side surface between the first inner surface and first opposing outermost radial surface of the first portion.

3. The holder of claim 1, wherein the first and second grooves are continuous.

4. The holder of claim 1, wherein the first and second portions have an end with a hinge and another end with a clasp that releasably interlocks the first and second portions.

5. The holder of claim 1, wherein the first and second portion are each composed of a thermoplastic material.

6. The holder of claim 1, wherein the plurality of flexible members are each composed of a thermoplastic material.

7. The holder of claim 1, wherein the flexible members are evenly spaced apart on the first and second portions.

8. The holder of claim 1, wherein one of the first and second portions has a recess within the outer surface.

9. The holder of claim 8, wherein the recess has a planar surface.

10. The holder of claim 1, wherein the first and second inner surfaces form the opening as circular.

11. The holder of claim 10, wherein the first and second outermost radial surfaces form a curved surface concentric with circular opening.

12. A holder for a current sensor, comprising:
    a first portion having a first inner surface, a first opposing outermost radial surface, a first opposing side surface and a second opposing side surface, wherein each side surface extends radially outward from the first inner surface to the first outermost radial surface, and a first groove formed in and extending along a circumferential length of the first outermost radial surface;

a second portion having a second inner surface, a second opposing outer surface, a first opposing side surface and a second opposing side surface, wherein each side surface extends radially outward from the second inner surface to the second outermost radial surface, and a second groove formed in and extending along a circumferential length of the second outermost radial surface, wherein the first portion is at least partially separable from the second portion, the first and second inner surfaces form an opening through the first and second portions, and the first groove joins the second groove; and a plurality of flexible members on the first and second portions and extending toward the opening, wherein the flexible members are configured to hold a line conductor substantially centered within the opening, wherein the first and second inner surfaces are disposed proximate to the line conductor when the line conductor is disposed within the opening, wherein the first and second portions have an end with a hinge and another end with a clasp that releasably interlocks the first and second portions, and wherein the first and second outermost radial surfaces form a curved surface substantially concentric with the line conductor when held by the flexible members, and wherein the first groove and the second groove are each configured to join one another and receive a current sensing coil.

13. The holder of claim 12, wherein at least a first flexible member is disposed on the first opposing side surface between the first inner surface and the first opposing outermost radial surface of the first portion and a second flexible member is disposed on the opposing second side surface between the first inner surface and first opposing outermost radial surface of the first portion.

14. The holder of claim 12, wherein the first and second grooves are continuous.

15. The holder of claim 12, wherein the first and second portion are each composed of a thermoplastic material.

16. The holder of claim 12, wherein the plurality of flexible members are each composed of a thermoplastic material.

17. The holder of claim 12, wherein the flexible members are evenly spaced apart on the first and second portions.

18. The holder of claim 12, wherein one of the first and second portions has a recess within the outermost radial surface.

19. The holder of claim 18, wherein the recess has a planar surface.

20. The holder of claim 12, wherein the first and second inner surfaces form the opening as circular.

* * * * *